United States Patent [19]
Yamagata et al.

[11] Patent Number: 5,648,174
[45] Date of Patent: Jul. 15, 1997

[54] HIGHLY HARD THIN FILM AND METHOD FOR PRODUCTION THEREOF

[75] Inventors: Hiroshi Yamagata, Toyama-ken; Akihisa Inoue, 11-806, Kawauchijutaku, Mubanchi, Kawauchi; Tsuyoshi Masumoto, 3-8-22, Kamisugi, both of Aoba-ku, Sendai-shi, Miyagi-ken; Junichi Nagahora, Yokohama, all of Japan

[73] Assignees: Yoshida Kogyo K.K., Tokyo; Tsuyoshi Masumoto; Akihisa Inoue, both of Miyagi-ken, all of Japan

[21] Appl. No.: 420,606

[22] Filed: Apr. 12, 1995

Related U.S. Application Data

[62] Division of Ser. No. 209,911, Mar. 14, 1994.

[30] Foreign Application Priority Data

Mar. 15, 1993 [JP] Japan ......... 5-78556
Nov. 15, 1993 [JP] Japan ......... 5-307097

[51] Int. Cl.$^6$ ......... C23C 14/00
[52] U.S. Cl. ......... 428/469; 428/212; 428/323; 428/457; 428/472; 428/698
[58] Field of Search ......... 428/472, 469, 428/452, 698, 212, 323

[56] References Cited

U.S. PATENT DOCUMENTS

| | | | |
|---|---|---|---|
| 4,592,781 | 6/1986 | Cheney et al. | 75/249 |
| 4,738,389 | 4/1988 | Moshier et al. | 228/198 |
| 4,770,701 | 9/1988 | Henderson et al. | 75/232 |
| 4,915,903 | 4/1990 | Brupbacher et al. | 420/129 |
| 4,915,905 | 4/1990 | Kampe et al. | 420/418 |
| 4,916,030 | 4/1990 | Christodoulou et al. | 428/614 |
| 4,921,531 | 5/1990 | Nagle et al. | 75/351 |
| 5,093,148 | 3/1992 | Christodoulou et al. | 427/37 |
| 5,093,207 | 3/1992 | Hodes et al. | 428/614 |
| 5,405,458 | 4/1995 | Yamagata et al. | 148/421 |
| 5,423,923 | 6/1995 | Yamagata et al. | 148/421 |

FOREIGN PATENT DOCUMENTS

| | | |
|---|---|---|
| 0354391 | 2/1990 | European Pat. Off. |
| 0588351 | 3/1994 | European Pat. Off. |

OTHER PUBLICATIONS

"Production of compositionally gradient Al-AlN films by reative sputtering and their mechanical and electrical properties", J. Appl. Phys. 71(7), Apr. 1, 1992, pp. 3278–3282.

*Primary Examiner*—Archene Turner
*Attorney, Agent, or Firm*—Finnegan, Henderson, Farabow, Garrett & Dunner, L.L.P.

[57] ABSTRACT

A hard thin film having fine crystalline ceramic particles dispersed in a metallic matrix phase is disclosed. The production of the film is effected by first depositing a substantially amorphous film on a substrate and then heat-treating the deposited film. Deposition of the film on the substrate is carried out by using a source of evaporation having a composition represented by the general formula: $Al_aM_b$, wherein M stands for at least one element selected from the group consisting of Ti, Ta, V, Cr, Zr, Nb, Mo, Hf, W, Mn, Fe, Co, Ni, and Cu and "a" and "b" respectively stand for atomic % in the ranges of $60 \leq a \leq 98.5$ and $1.5 \leq b \leq 40$, providing a+b=100. Deposition is effected by a physical vapor deposition process in an atmosphere of an inert gas containing a reaction gas while controlling the feed rate of the reaction gas into a chamber in such a manner that the partial pressure of the react/on gas is kept constant or varied continuously or stepwise. By this method, there can be obtained a hard composite film having fine ceramic particles dispersed in a metallic matrix phase or a dense, hard, and composite film having a composition and structure obliquely varied from a substantially crystalline metallic phase to a crystalline ceramic phase in the direction of thickness of the film.

19 Claims, 11 Drawing Sheets

SURFACE OF FILM

SUBSTRATE SIDE

SURFACE OF FILM

SUBSTRATE SIDE

HIGHLY HARD THIN FILM AND METHOD FOR PRODUCTION THEREOF

This is a division of application Ser. No. 08/209,911, filed Mar. 14, 1994, pending.

BACKGROUND OF THE INVENTION

1. Field of the Invention:

This invention relates to a highly hard thin film having fine crystalline ceramic particles dispersed in a metallic matrix phase and a method for the production thereof. More particularly, it relates to a hard wear-resistant film which has a highly hard ceramic surface, exhibits satisfactory adhesiveness to a substrate, excels in resistance to crushing and proves useful as high-strength materials, wear-resistant materials, and high temperature-resistant materials in a wide variety of industrial applications.

2. Description of the Prior Art:

As wear-resistant coating materials for protecting machine parts and tools against wear and scratches, such materials as TiN, TiC, WC, and Al—Ti—N alloy have been heretofore used. The films of these materials are generally formed by such physical vapor deposition processes as the reactive sputtering process and the ion plating process and are used as wear-resistant films. In order for these films to acquire ample hardness, they are required to have their nitrogen content or carbon content increased to a certain extent. The increase of the nitrogen or carbon content in the film, however, has the possibility of inflicting persistent residual stress on the film after the treatment. Further, since the crystalline particles of the columnar structure precipitate in the film depending on the conditions adopted for the deposition of film, a fracture suffered to occur inside the film possibly exerts an adverse effect on the normal part of the film surrounding the fracture and thus the film becomes mechanically brittle.

Further, the formed film is required to be dense and to excel in adhesiveness to a substrate. In general, preparatorily to the deposition of a desired hard film on a given substrate, the substrate is given such pretreatments as degreasing and etching. Then, the desired hard film is directly deposited on the freshly pretreated substrate. In the case of the film thus deposited, since the physical characteristics of the substrate and those of the film differ extremely at times, the adhesiveness of the film to the substrate becomes insufficient. To avoid this disadvantage, the practice of preheating the substrate and then depositing the film on the preheated substrate has been in vogue. In spite of these elaborate treatments, the film is still at a disadvantage in manifesting a columnar crystalline structure which makes the film mechanically brittle.

SUMMARY OF THE INVENTION

Accordingly, it is an object of the present invention to provide a hard composite film which has highly hard fine particles uniformly dispersed therein and, consequently, excels in adhesiveness to a substrate, exhibits high hardness, and enjoys generous alleviation of the brittleness, a drawback inherently found in ceramic materials, throughout the entire volume thereof.

A further object of the present invention is to provide a dense, hard, and wear-resistant film which has fine ceramic particles dispersed therein in such a manner as to form a film of a functionally gradient structure having the ratio of dispersion of fine ceramic particles in a metallic matrix phase increased in the direction of thickness of the film and, consequently, excels in adhesiveness to a substrate and in resistance to crushing and exhibits high hardness.

Another object of the present invention is to provide a method which permits a very hard wear-resistant thin film possessing such outstanding properties as mentioned above to be formed on a substrate by a relatively simple procedure using a physical vapor deposition process and a heat treatment.

In accordance with the present invention, to accomplish the objects described above, there is provided a hard thin film which is characterized by having fine crystalline particles dispersed in a metallic matrix phase having a composition represented by the general formula: $Al_aM_b$, wherein M stands for at least one element selected from the group consisting of Ti, Ta, V, Cr, Zr, Nb, Mo, Hf, W, Mn, Fe, Co, Ni, and Cu and "a" and "b" stand for atomic % respectively in the ranges of $60 \leq a \leq 98.5$ and $1.5 \leq b \leq 40$, providing $a+b=100$. Preferably, the crystalline particles dispersed in the metallic matrix are ceramic particles of not more than 500 nm, preferably not more than 100 nm, in diameter. The metallic matrix phase may be a substantially amorphous phase or crystalline phase.

The hard thin film may be a film of a uniform composition having the fine crystalline particles uniformly dispersed in the matrix phase throughout the entire volume thereof or a film of a functionally gradient structure in which the ratio of dispersion of the fine crystalline particles in the matrix phase increases continuously or stepwise in the direction of thickness of the film. In one preferred mode, the hard thin film has a composition and structure obliquely varied from a substantially crystalline metallic phase having the composition mentioned above to a crystalline ceramic phase, in which the ratio of dispersion of fine ceramic particles in the matrix phase of the substantially crystalline metal increased in the direction of thickness of the film.

Further in accordance with the present invention, there are provided methods for the production of the hard thin films mentioned above.

In one aspect of the present invention, the method comprises:

(A) a step of forming a film on a substrate comprising:

(1) setting in place a substrate and a material having a composition represented by the general formula: $Al_aM_b$, wherein M, "a" and "b" have the same meanings as defined above, as a source of evaporation in a deposition chamber and (2) effecting deposition of an amorphous film on the substrate by a physical vapor deposition process in an atmosphere of an inert gas containing a reaction gas selected from the group consisting of nitrogen, oxygen and carbon-containing compound, while controlling the partial pressure of the reaction gas in the atmosphere within the range capable of forming an amorphous phase depending on the source of evaporation to be used; and (B) a step of heat-treating the film obtained by the step (A) mentioned above in an atmosphere of an inert gas thereby giving rise to a film having fine crystalline particles dispersed in a metallic matrix phase. Preferably, the feed rate of the reaction gas into the deposition chamber may be controlled in such a manner that a partial pressure of the reaction gas in the atmosphere is kept constant or varied continuously or stepwise.

In another aspect of the present invention, the method comprises:

(A) a step of forming a film on a substrate comprising:

(1) setting in place a substrate and a material having a composition represented by the general formula: $Al_aM_b$, wherein M, "a" and "b" have the same meanings as defined above, as a source of evaporation in a deposition chamber and (2) effecting deposition of a structurally gradient film on the substrate by a physical vapor deposition process in an atmosphere of an inert gas containing a reaction gas selected from the group consisting of nitrogen, oxygen and carbon-containing compound, while controlling the feed rate of the reaction gas into the deposition chamber so that the partial pressure of the reaction gas in the atmosphere is varied from a level capable of forming an amorphous phase to a level capable of forming a crystalline phase depending on the source of evaporation to be used, thereby forming the structurally gradient film having a gradient concentration of a chemical component of the reaction gas which increases in the direction of the surface of the film and having a composition and structure obliquely varied from a substantially amorphous metallic phase in the part contacting the substrate to a crystalline ceramic phase of the surface layer part of the film; and (B) a step of heat-treating the structurally gradient film obtained by the step (A) mentioned above in an atmosphere of an inert gas thereby giving rise to a film having the ratio of dispersion of fine ceramic particles therein increased in the direction of the surface of the film and having the composition and structure obliquely varied from a substantially crystalline metallic phase to a crystalline ceramic phase. Preferably, the feed rate of the reaction gas into the deposition chamber is varied continuously or stepwise.

In both methods mentioned above, preferably, the deposition of the film on the substrate is carried out by a sputtering process or an ion plating process, and the heat treatment is carried out at a temperature exceeding the crystallization temperature of an amorphous film formed at the highest partial pressure of the reaction gas that allows formation of an amorphous film with a source of evaporation having a given composition.

BRIEF DESCRIPTION OF THE DRAWINGS

Other objects, features, and advantages of the invention will become apparent from the following description taken together with the drawings, in which:

FIG. 15 is a graph showing the Knoop hardness in the direction of thickness of a structurally gradient hard Al—Ti—N thin film having a composition of $(Al_{80}Ti_{20})_{100-x}N_x$ produced in Example 2 and of the film obtained by heat-treating the film mentioned above;

FIG. 16 is a graph showing the results of a test for adhesiveness performed by the scratching method on the same hard Al—Ti—N thin films as shown in FIG. 15;

FIG. 17 is a schematic diagram of a sputter deposition device used in Example 3 to be described hereinafter;

FIG. 18 is a diagram showing X-ray diffraction patterns obtained of the thin films of varying uniform compositions of $(Al_{80}Mn_{20})_{100-x}N_x$ produced at severally fixed partial pressures of nitrogen, with the X-ray diffraction patterns illustrated as shifted in the direction of intensity along the ordinate axis in the order in which the partial pressures of nitrogen increase;

FIG. 19 is a graph showing the relation between the partial pressure of nitrogen and the crystallization temperature (Tx) obtained of the thin films of varying uniform compositions of $(Al_{80}Mn_{20})_{100-x}N_x$ produced at severally fixed partial pressures of nitrogen in Example 3;

FIG. 20 is a graph showing the relation between the partial pressure of nitrogen and the Knoop hardness of the thin films of varying uniform compositions of $(Al_{80}Mn_{20})_{100-x}N_x$ produced at severally fixed partial pressures of nitrogen in Example 3.

FIG. 21 is a graph showing the Knoop hardness in the direction of thickness of a structurally gradient Al—Mn—N thin film having a composition of $(Al_{80}Mn_{20})_{100-x}N_x$ produced in Example 3 and of the film obtained by heat-treating the film mentioned above; and FIG. 22 is a graph showing the results of a scratch test performed on the same hard Al—Mn—N thin films as shown in FIG. 21.

DETAILED DESCRIPTION OF THE INVENTION

Figure 1:
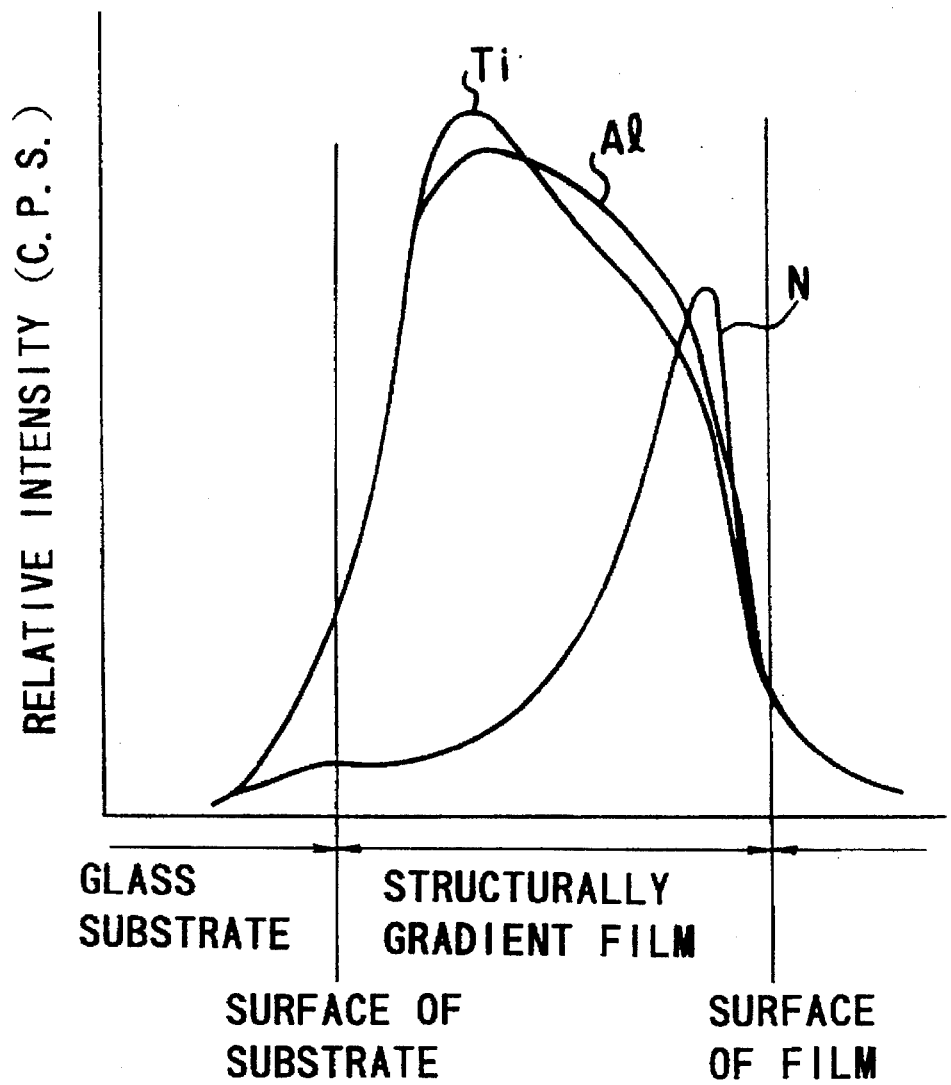
FIG. 1 is a line profile showing the variation of composition determined by the EDX (energy dispersive X-ray spectroscopy) in the cross section of a structurally gradient film having a composition of $(Al_{80}Ti_{20})_{100-x}N_x$ and produced by using 80 at % Al-20 at % Ti alloy.

In accordance with the present invention, in the formation of a film on a substrate by a physical vapor deposition process, particularly the sputtering process or the ion plating process, a material of a composition capable of forming an amorphous film or a film having fine crystalline ceramic particles precipitated and dispersed in an amorphous film depending on the partial pressure of reaction gas in an atmosphere of an inert gas is used as a target (material for evaporation), and the formation of a hard thin film is effected by two steps: (A) formation of an amorphous film or an amorphous film having fine crystalline particles precipitated and dispersed therein and (B) heat treatment of the amorphous film obtained by the preceding step (A).

The formation of an amorphous film in the step (A) mentioned above is carried out by setting in place a substrate and a material having a composition represented by the general formula: $Al_aM_b$, wherein M stands for at least one element selected from the group consisting of Ti, Ta, V, Cr, Zr, Nb, Mo, Hf, W, Mn, Fe, Co, Ni, and Cu and "a" and "b" stand for atomic % respectively in the ranges of $60 \leq a \leq 98.5$ and $1.5 \leq b \leq 40$, providing a+b=100, as a source of evaporation in a deposition chamber and effecting deposition of the amorphous film on the substrate by the physical vapor deposition process in an atmosphere of an inert gas containing a reaction gas, such as nitrogen, oxygen, or carbon-containing compound, while controlling the feed rate of the reaction gas into the deposition chamber so that the partial pressure of the reaction gas in the atmosphere is kept constant or varied continuously or stepwise within a range capable of forming the amorphous phase. Specifically, when the formation of the amorphous film is effected by introducing an inert gas such as At, He, Ne, Xe, or Kr into a deposition device to keep the total gas pressure in the deposition device at a low level in the range of 0.6 to 1.2 Pa and supplying a reaction gas such as nitrogen gas, ammonia gas, or methane gas to the deposition device while controlling the feed rate of the reaction gas so as to keep the partial pressure of the reaction gas at a fixed level, then the amorphous film having a substantially uniform concentration of the component of the reaction gas throughout the entire volume thereof may be obtained. On the other hand, when the feed rate of the reaction gas is so controlled that the partial pressure of the reaction gas in the atmosphere is increased continuously or stepwise, there can be obtained the amorphous film having a gradient concentration of the component of the reaction gas which increases from the film-substrate interface to a maximum at or near the surface of the film.

In another aspect of the present invention, the feed rate of the reaction gas into the deposition chamber is controlled in such a manner that the partial pressure of the reaction gas in the atmosphere is varied continuously or stepwise from a level capable of forming the amorphous phase to a level capable of causing the precipitation of crystalline ceramic particles depending on the source of evaporation to be used. In this case, there can be obtained a structurally gradient film or functionally gradient film having a gradient concentration of a chemical component of the reaction gas which increases in the direction of the surface of the film and having a composition and structure obliquely varied from the substantially amorphous metallic phase of the part being in contact with the substrate to the crystalline ceramic phase of the surface layer part of the film.

The amorphous film or the structurally gradient film obtained by the aforementioned step (A) is then subjected to a heat treatment in an atmosphere of an inert gas (step (B)).

When the amorphous film is subjected to the heat treatment, a hard film having fine crystalline ceramic particles precipitated and dispersed in a metallic matrix phase can be obtained. The hard film thus obtained may be a film having a structure such that fine crystalline particles are precipitated and dispersed substantially uniformly in the matrix phase throughout the entire volume thereof, or a film in which the composition and structure of the part contiguous to the substrate are different from the composition and structure of the uppermost surface part of the film and the composition and structure of the film, therefore, may vary continuously or stepwise in the direction of thickness of the film. Specifically, when the amorphous film having a substantially uniform concentration of the chemical component of the reaction gas throughout the entire volume thereof is subjected to the heat treatment, there can be obtained a film of a uniform composition having fine crystalline particles uniformly dispersed throughout the entire volume of the metallic matrix phase. On the other hand, when the amorphous film having a gradient concentration of the chemical component of the reaction gas which increases from the film-substrate interface to a maximum at or near the surface of the film is subjected to the heat treatment, there can be obtained a film of functionally gradient structure such that the proportion of fine crystalline particles dispersed in the metallic matrix phase increases in the direction of the surface of the film and the composition and structure of the film is varied continuously or stepwise in the direction of thickness of the film from the substantially amorphous metal to the crystalline ceramic. The heat treatment of the amorphous film in this case is desired to be carried out by keeping the formed amorphous film generally at a temperature of not less than 350° C., preferably at a temperature exceeding the crystallization temperature of the film for a period exceeding 30 minutes. The metallic matrix phase may be a substantially amorphous phase or crystalline phase, which can be controlled by suitably selecting the conditions for heat treatment, such as the temperature and duration thereof.

For instance, when $Al_{80}Ti_{20}$ alloy is used as a source of evaporation and nitrogen gas is used as a reaction gas, the amorphous film can be formed under a partial pressure of nitrogen in the range of 0.005 to 0.087 Pa. The crystallization temperature of this amorphous film varies from 389° C. (at 0.021 Pa) to 455° C. (at 0.072 Pa) in proportion as the partial pressure of nitrogen increases during the course of the deposition of film. The film is obtained with great hardness when the heat treatment is carried out in the atmosphere of the inert gas at a temperature exceeding the crystallization temperature. When this film was observed through a transmission electron microscope, it was found that extremely fine particles having diameters of the order of several nm to 10-odd nm were precipitated in a metallic matrix phase and that these fine particles, unlike the fine particles of the columnar structure observed in the conventional thin film, lacked isotropy as in grain boundary. Thus, a film of great hardness which precludes such problems as are suffered by the film produced by the conventional technique, possesses exceptional density, execls in adhesiveness to a substrate, and does not manifest the brittleness, i.e. a defect inherent in ceramic materials, can be produced.

In another aspect of the present invention, by controlling the feed rate of the nitrogen gas into the deposition chamber in such a manner that the partial pressure of nitrogen in the chamber is continuously or stepwise increased from the lower level capable of forming the amorphous film as mentioned above to the higher level capable of causing the precipitation of fine nitride ceramic particles, i.e. the partial pressure of nitrogen more than 0.087 Pa, during the growth of film, there is obtained a film of a gradient structure consisting mainly of a metallic amorphous phase which contains a gradient of nitrogen concentration increased continuously or stepwise in the direction of the surface of the film and further comprising a substantially crystalline ceramic phase in the surface layer part of the film containing fine nitride particles precipitated therein. When this structurally gradient film is subjected to the heat treatment for crystallization, there can be obtained a hard film having a composition and a structure obliquely varied from a substantially crystalline metallic phase to a crystalline ceramic phase, in which the ratio of dispersion of fine ceramic particles increases in the direction of thickness of the film.

The conceivable types (structures) of this film of gradient pattern include:

(1) A structure in which the part contiguous to the surface of a substrate forms a metallic phase (formed exclusively of a matrix phase or of the combination of a matrix phase and other compound phase), fine nitride particles begin to precipitate halfway along the thickness of the film, the precipitation gains in density in the direction of the surface of the film, and the surface part of the film forms an (Al, M)N crystalline ceramic phase, and (2) A structure in which fine nitride particles gain in desity from the part contiguous to the surface of a substrate to the surface part of the film and the surface of the film forms an (Al, M)N crystalline ceramic phase.

By continuously varying physical characteristics of the film from the substrate through a hard layer deposited thereon thereby nullifying a sudden difference of the physical characteristics across the interface between the substrate and the film, the adhesiveness of the film to a substrate is improved. In accordance with the present invention, to preclude the formation of crystals of columnar structure in the film, an amorphous phase is formed preparatorily and then this amorphous phase is crystallized by a heat treatment. As a result, fine crystalline particles (metal, intermetallic compound, and nitride) not exceeding 100 nm in diameter are formed inside the structurally gradient film and give birth to a densified very hard film. Since the formed crystalline particles predominantly comprise fine crystalline particles not exceeding some tens of nm in diameter, the film acquires improved resistance to crushing because a fracture if any suffered to occur in the film does not easily exert an adverse effect on the normal part surrounding the site of fracture.

The other ingredient of the vaporizing source material to be used in the present invention, namely the refractory metal such as Ti, Ta, V, Cr, Zr, Nb, Mo, Hf, W, Mn, Fe, Co, Ni, and Cu is a substance having only small diffusibility in the aluminum matrix, forming a varying metastable or stable intermetallic compound, and contributing to stabilize a microcrystalline texture at elevated tempratures. These metals are known to form nitride exhibiting electroconductivity or materials excelling in resistance to corrosion.

As means for the aforementioned deposition, the sputtering process and the ion plating process may be cited. The source of evaporation may be a single source of evaporation using compounds or mixtures which contain necessary compositions. Where a plurality of sources of evaporation are simultaneously used, each of the sources of evaporation may be made of a material of a single composition or a combination of the aforementioned sources of evaporation. Now, the steps of process described above and the technical significances thereof will be explained below with reference to specific data.

(A) Step for formation of an amorphous film or a structurally gradient film:

When a film is deposited on a substrate in an atomsphere of an inert gas containing a prescribed amount of nitrogen gas by the physical vapor deposition process, particularly the sputtering method or the ion plating method, and by using a vaporizing source material (target) of a composition represented by the general formula, $Al_aM_b$ (wherein M, "a", and "b" have the same meanings as defined above), an amorphous film having a uniform nitrogen concentration, an amorphous film having the nitrogen concentration increased continuously or stepwise in the direction of the surface of the film, or a structurally gradient film having a composition and a structure varied from a substantially amorphous metallic phase in the part being in contact with the substrate to an (Al, M)N crystalline ceramic phase is formed, depending on the partial pressure of nitrogen in the deposition chamber or the manner of controlling the feed rate of nitrogen gas thereinto.

This phenomenon will be described below with reference to FIG. 1 and FIG. 2.

FIG. 1 represents the results of linear analysis performed by the EDX (energy dispersive X-ray spectroscopy), which show a change in each component found in the section of the film obtained by using 80 at % Al-20 at % Ti alloy as a target. The film was deposited on a glass substrate in the same manner as in Example 1 to be described hereinafter, except that the flow rate of the nitrogen gas introduced as a reaction gas into a deposition chamber was continuously increased over a period of 180 minutes and in this while the partial pressure of nitrogen varied from 0 Pa to 0.129 Pa. The film obtained as a result had an overall thickness of 5 μm. By observation through an electron microscope, it was found that the section of this film had a dense structure and showed no columnar structure. As clearly noted from FIG. 1, the nitrogen content in the film continuously increased from the upper surface of the glass substrate to the surface of the film.

Figure 2:
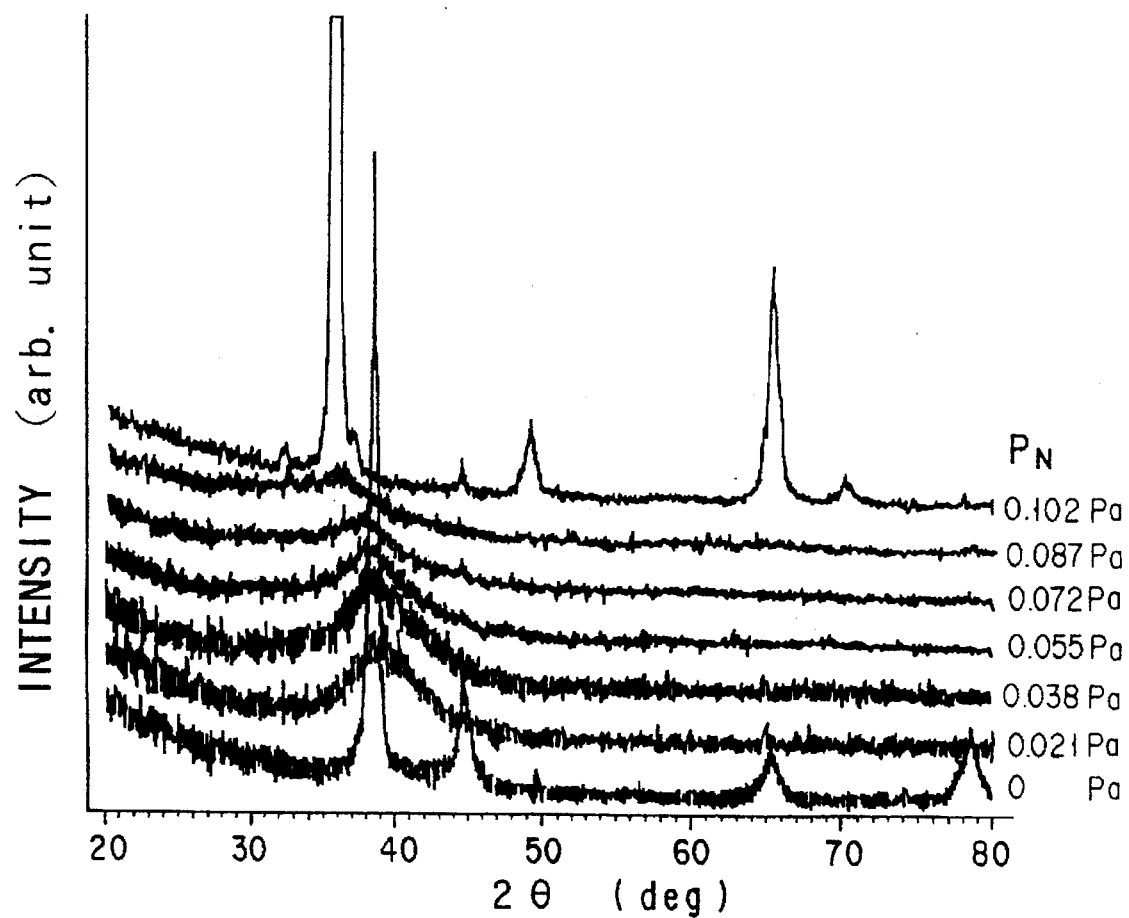
FIG. 2 is a diagram showing X-ray diffraction patterns obtained of the thin films of varying uniform compositions of $(Al_{80}Ti_{20})_{100-x}N_x$ produced at severally fixed partial pressures of nitrogen, with the X-ray diffraction patterns illustrated as shifted in the direction of intensity along the ordinate axis in the order in which the partial pressures of nitrogen increase.

FIG. 2 represents the results of analysis performed by the X-ray diffraction on films of uniform composition produced at varying fixed partial pressures of nitrogen. The X-ray diffraction patterns of the films of varying uniform compositions are collectively shown as shifted in the direction of intensity of the ordinate axis in the order in which the relevant partial pressures of nitrogen increase to facilitate comprehension. It is clearly noted from FIG. 2 that the data obtained of the metallic film produced in the absence of nitrogen gas indicate those of aluminum crystal, implying a state having aluminum crystals dispersed in an amorphous metal. The expression "substantially amorphous metal" used herein shall be construed as embracing such a structure. When the partial pressure of nitrogen was increased, the film acquired an amorphous structure at the partial pressure of nitrogen in the range of 0.021 to 0.087 Pa. When the partial pressure of nitrogen was further increased, the film changes to a final ceramic crystalline phase composed of a solid solution of Ti in AlN crystals at 0.102 Pa.

The amorphous film having the nitrogen concentration therein fixed at a prescribed level or increased continuously or stepwise in the direction of the surface thereof is obtained, therefore, by controlling the feed rate of nitrogen gas into the deposition chamber during the growth of film such that the partial pressure of nitrogen is fixed or varied either continuously or stepwise within the range in which the amorphous film is formed depending on the vaporizing source material to be used. Alternatively, the structurally gradient film consisting predominantly of a metallic amorphous phase which has the nitrogen concentration increased continuously or stepwise in the direction of the surface of the film and further comprising the surface layer part of a substantially crystalline ceramic phase having fine nitride particles precipitated therein can be formed by controlling the feed rate of nitrogen gas into the deposition chamber such that the partial pressure of nitrogen varies either continuously or stepwise from the partial pressure capable of forming an amorphous phase to the partial pressure capable of forming a crystalline phase depending on the vaporizing source material to be used.

Figure 3:
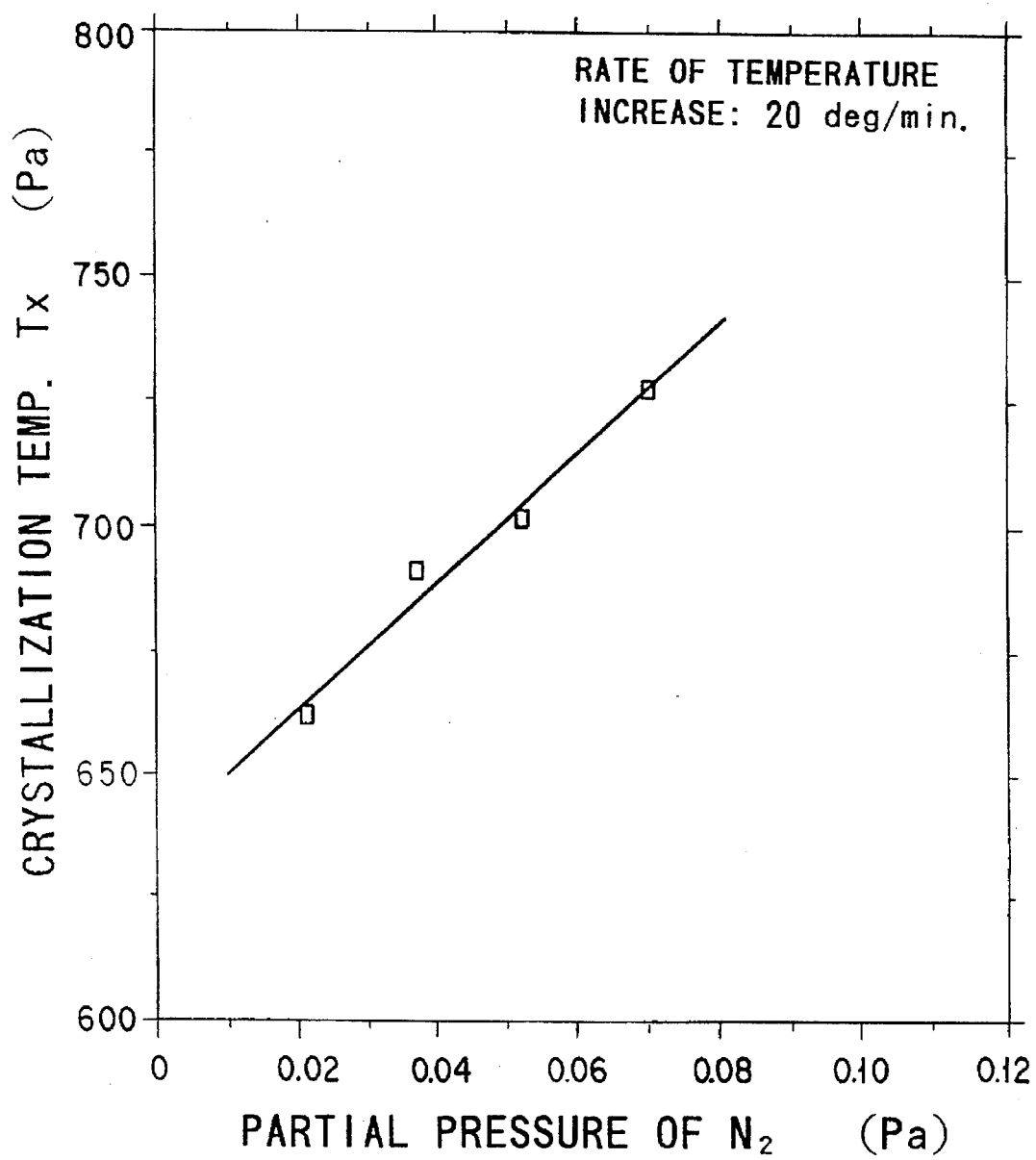
FIG. 3 is a graph showing the relation between the partial pressure of nitrogen and the crystallization temperature (Tx) obtained of the thin films of varying uniform compositions of $(Al_{80}Ti_{20})_{100-x}N_x$ produced at severally fixed partial pressures of nitrogen.
Figure 4:
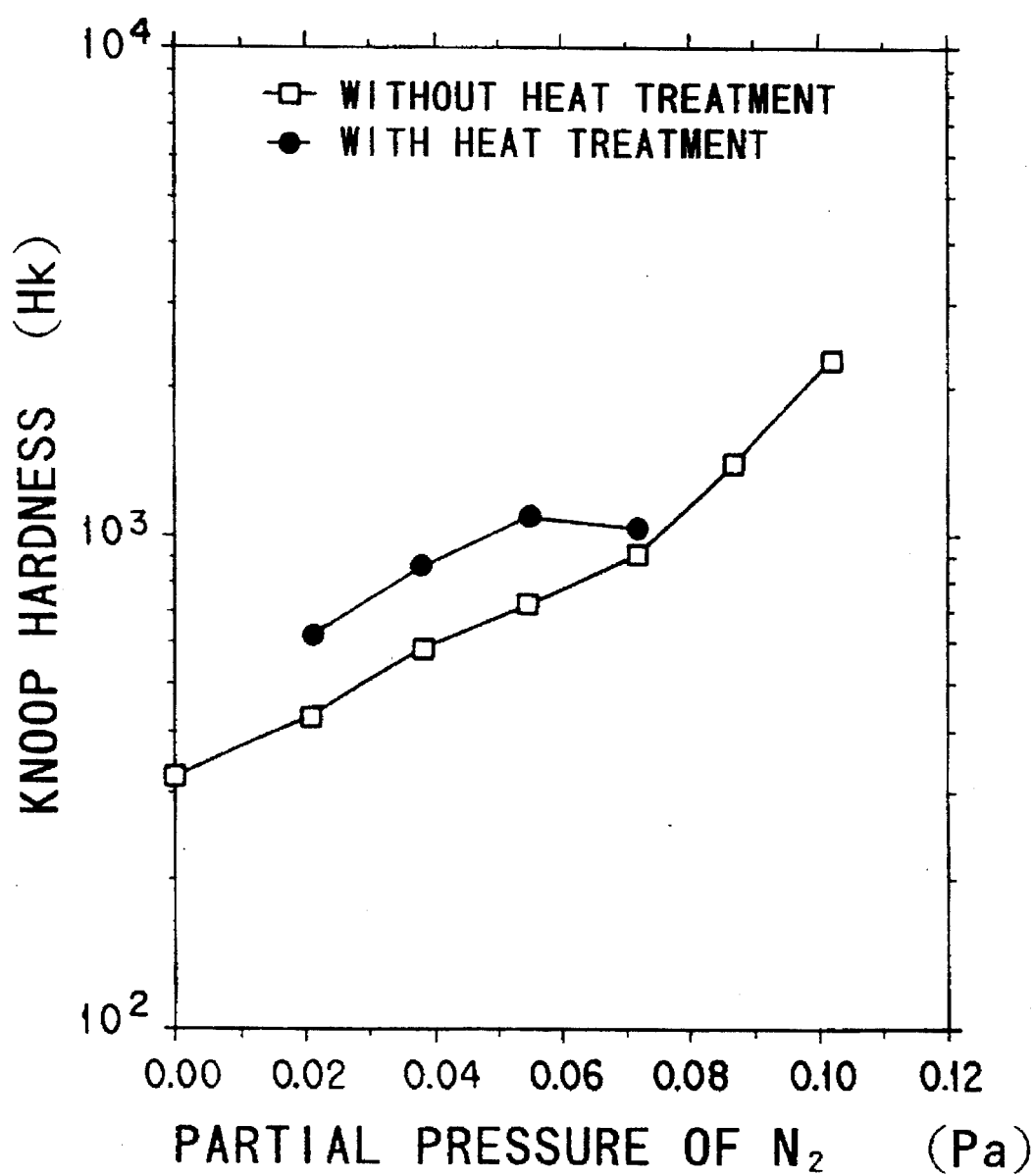
FIG. 4 is a graph showing the relations between the partial pressure of nitrogen and the Knoop hardness of the thin films of varying uniform compositions of $(Al_{80}Ti_{20})_{100-x}N_x$ produced at severally fixed partial pressures of nitrogen and of the films obtained by heat-treating the thin films mentioned above.

The relation between the partial pressure of nitrogen and the crystallization temperature (Tx) determined with a differential scanning calorimeter (DSC) obtained of films of a uniform composition produced under severally fixed partial pressures of nitrogen is shown in FIG. 3. The relation between the partial pressure of nitrogen and the Knoop hardness determined with a microhardness tester obtained of the same films are shown in FIG. 4. It is clearly noted from FIG. 3 and FIG. 4 that the crystallization temperature of the film formed of an amorphous phase increased from 661K (at 0.021 Pa) to 727K (at 0.072 Pa) in proportion as the partial pressure of nitrogen increased and the Knoop hardness of the film, similarly, extremely increased from 330 Hk (at 0 Pa) to 2310 Hk (at 0.11 Pa).

Figure 5:
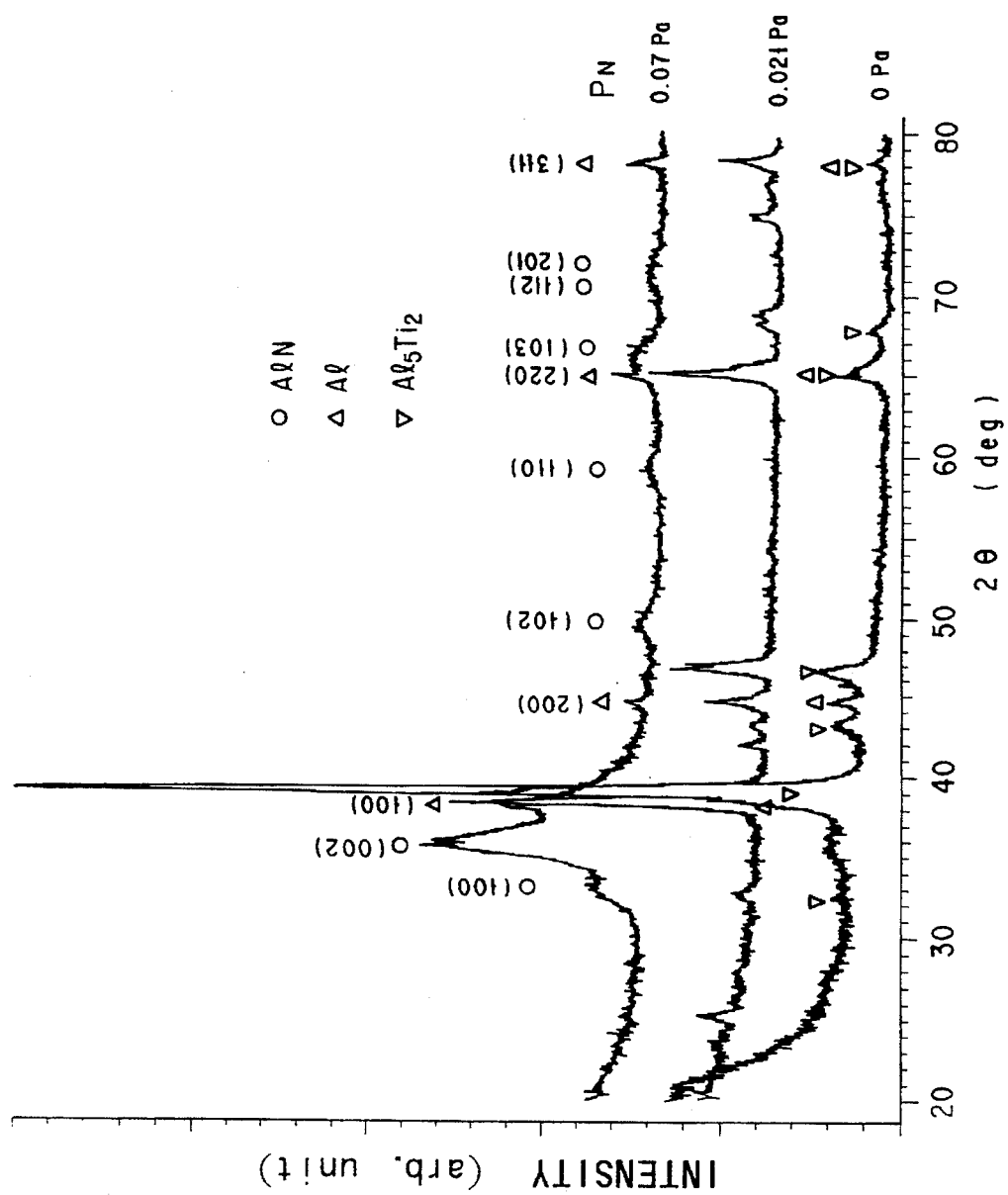
FIG. 5 is a diagram showing the X-ray diffraction patterns of films obtained by heat-treating the thin films of varying uniform compositions of $(Al_{80}Ti_{20})_{100-x}N_x$ produced at severally fixed partial pressures of nitrogen, with the X-ray diffraction patterns illustrated as shifted in the direction of intensity along the ordinate axis in the order in which the partial pressures of nitrogen increase.

(B) Step for heat-treating an amorphous film or a structurally gradient film obtained in the preceding step:

The results of X-ray diffraction analysis of films obtained by heat-treating at 527° C. for four hours amorphous films of a uniform composition produced under severally fixed partial pressures of nitrogen are shown in FIG. 5. It is noted from the results shown in FIG. 5 that the heat treatment gave to the amorphous films produed fine crystalline particles of metal (Al) and intermetallic compound ($Al_5Ti_2$) in the films produced under low partial pressures of nitrogen and fine ceramic particles of nitride (AlN) besides these crystalline particles in the films produced under high partial pressures of nitrogen.

When these films were observed through a transmission electron microscope, it was found that extremely fine crystalline particles having diameters of the order of several nm to some tens of nm were precipitated in their metallic matrix phases and that these fine particles, unlike the particles of columnar structure found in ordinary thin films, lacked isotropy as in grain boundary. This fact indicates that the heat treatment permits production of a highly hard film which enjoys extremely high density, excels in adhesiveness to a substrate, and avoids manifesting the brittleness, a fault inherent in ceramic materials.

In case of a structurally gradient film having a composition and structure obliquely varied in the direction of the surface of the film from a substantially amorphous metallic phase in the part contiguous to a substrate to a crystalline ceramic phase of the surface layer part of the film, the heat treatment is carried out at a temperature exceeding the crystallization temperature (Tx) of an amorphous film produced at the highest partial pressure of nitrogen that permits formation of the amorphous film (0.087 Pa in the case of using the aforementioned $Al_{80}Ti_{20}$ alloy as a target). In consequence of this heat treatment, there can be obtained a dense, structurally gradient film in which fine crystalline particles (metal, intermetallic compound, and nitride) are precipitated therein, the ratio of precipitation and dispersion of fine nitride ceramic particles are gradually increased in the direction of thickness of the film, and the composition and structure of the film are varied from the substantially crystalline metallic phase of the part of the film formed under the lowest partial pressure of nitrogen to the (Al, Ti)N crystalline ceramic phase of the surface layer part of the film produced under the highest partial pressure of nitrogen. The produced film has the Knoop hardness increased in a gradient pattern from the substrate side to the surface of the film and this film exhibits improved adhesiveness to a substrate.

As respects the conditions for the heat treatment mentioned above, the temperature of the heat treatment is desired to exceed the crystallization temperature (Tx) mentioned above and the duration of the heat treatment is desired to be sufficient for inducing crystallization of the amorphous phase. Generally, the heat treatment consists in keeping a given sample at the temperature mentioned above for at least 30 minutes. The heat treatment will fail to induce the precipitation of crystalline particles when the temperature of this heat treatment is below the crystallization temperature mentioned above or the duration of the heat treatment is not sufficient. Since the crystallization temperature varies with the partial pressure of nitrogen during the deposition of the amorphous film as described above, the conditions for the heat treatment ought to be set in accordance with the conditions for the deposition of film. The rate of temperature increase is desired to be not more than 15° C./minute. If the rate of temperature increase exceeds 15° C./minute, the heat treatment tends to bring about an undesirable effect of causing separation between the substrate and the film because of a difference in thermal expansion coefficient. The diameters of the crystalline particles which are precipitated owing to the heat treatment must be not more than 1,000 nm. When the heat treatment is excessive and the diameters of the crystalline particles exceed this upper limit, the heat treatment will bring about an undesirable effect of inducing a decrease in strength of the film.

As described in detail above, the film obtained by the present invention is a hard composite film which has fine ceramic particles precipitated and dispersed in a metallic matrix phase or a dense, hard, and composite film having a composition and a structure obliquely varied from a substantially crystalline metallic phase to a crystalline ceramic phase of the surface layer part, with the ratio of dispersion of fine ceramic particles increased in the direction of thickness of the film. The film exhibits excellent properties such as satisfactory adhesiveness to a substrate, strong resistance to crushing and to bending, and high hardness and, threfore, proves useful as a wear-resistant film. Further, since the film possesses high hardness and electroconductivity, it can be used as a wear-resistant electric contact. In addition thereto, since the hard film of the present invention exhibits outstanding mechanical and electrical properties and, at the same time, enjoys alleviation of the brittleness which forms a drawback of ceramic material, it can be used as electric and electronic materials, high-strength materials, wear-resistant materials, and highly refractory materials and find extensive utility in numerous industrial fields.

Now, the present invention will be described more specifically below with reference to working examples.

EXAMPLE 1

(A) Formation of an amorphous film:

A target made of an alloy of 80 at % Al-20 at % Ti was set in place as opposed to an electrode (grounding potential) inside a magnetron sputter deposition device and a substrate made of a glass plate or aluminum plate to be subjected to deposition was disposed between the electrode and the target to deposit a film on each plate. The sputter device was evacuated by means of a vacuum pump and then supplied with argon gas until the total gas pressure inside the device reached 1 Pa.

Preparatorily to the coating operation, a high frequency power source was connected to a jig serving to fix the glass substrate or aluminum substrate in place and the sputter-etching of the glass substrate or the aluminum substrate was effected for 10 minutes.

Then, a DC power source was connected to the target and a preliminary discharge was effected for 10 minutes. At this time, a stainless steel plate as a shutter was set in place in front of the glass substrate or the aluminum substrate so as to prevent the glass substrate or the aluminum substrate from the coating due to the preliminary discharge. This preliminary discharge had a purpose of removing the gas and moisture adhering to the surface of the target.

After this preliminary discharge was completed, the shutter was moved and the coating of the glass substrate or the aluminum substrate was started. The substrate was not heated prior to the coating.

While the coating was in process, the amount of supply of the nitrogen gas introduced as a reaction gas into the device was kept at a prescribed fixed flow rate by means of an electrically controllable flow rate adjusting meter. In this while, the partial pressure of nitrogen varied from 0 Pa to 0.129 Pa.

The variation of the pressure inside the device due to a difference in the amount of nitrogen gas to be introduced was adjusted by means of a valve interposed between a discharge pump and the device so that the total pressure inside the device was kept at 1 Pa.

(B) Heat treatment:

The heat treatment was performed on a given sample placed in a furnace after the furnace had been evacuated with a vacuum pump to $1 \times 10^{-5}$ Torr and, after the stop of the evacuation, filled with argon gas to normal atmospheric pressure. During the heat treatment, argon gas was constantly introduced into the furnace for the purpose of displacing the internal gas of the furnace.

The temperature of the sample was continuously elevated from a room temperature to 540° C. over a period of two hours. The temperature of the heat treatment, 540° C., was retained for two hours.

After the heat treatment, the power source for the heater was turned off to allow the sample to cool off spontaneously.

The results of analysis performed by the X-ray diffraction on films of uniform composition produced at varying prescribed partial pressures of nitrogen are shown in FIG. 2. The X-ray diffraction patterns of the films of varying uniform compositions are collectively shown as shifted in the order in which the relevant partial pressures of nitrogen increase in the direction of intensity of the vertical axis of the coordinates system to facilitate comprehension. It is clearly noted from FIG. 2 that the data shown therein indicate that the metallic film obtained in the absence of nitrogen gas consisted of aluminum crystals and that the film acquired an amorphous structure when the partial pressure of nitrogen was severally 0.021 Pa, 0.038 Pa, 0.055 Pa, 0.072 Pa, and 0.087 Pa.

The films obtained by heat-treating the amorphous films were tested for Knoop hardness with a microhardness tester. The results are shown in FIG. 4 and Table 1 below.

TABLE 1

| Partial pressure of nitrogen (Pa) | 0.021 | 0.038 | 0.055 | 0.072 |
|---|---|---|---|---|
| Crystallization temperature (°C.) | 389 | 418 | 429 | 455 |
| Knoop hardness (Hk) | | | | |
| Before heat treatment | 427 | 582 | 718 | 911 |
| After heat treatment | 618 | 856 | 1093 | 1035 |

It is clearly noted from FIG. 4 and Table 1 given above that the heat treatment allowed the amorphous films to acquire increase in hardness and the addition to the partial pressure of nitrogen during the growth of film resulted in a proportionate increase in hardness. It is, however, noted that the hardness tended to decrease after the partial pressure of nitrogen has risen to a certain level. This trend may be ascribed to the influence of residual stress generated in the film during the growth of the film.

Figure 6:
FIG. 6 is a transmission electron micrograph showing a bright-field image in 100,000 magnifications of a hard Al—Ti—N thin film obtained by heat-treating an amorphous film having a composition of $(Al_{80}Ti_{20})_{100-x}N_x$ produced at a partial pressure of nitrogen of 0.052 Pa in Example 1 to be described hereinafter.
Figure 7:
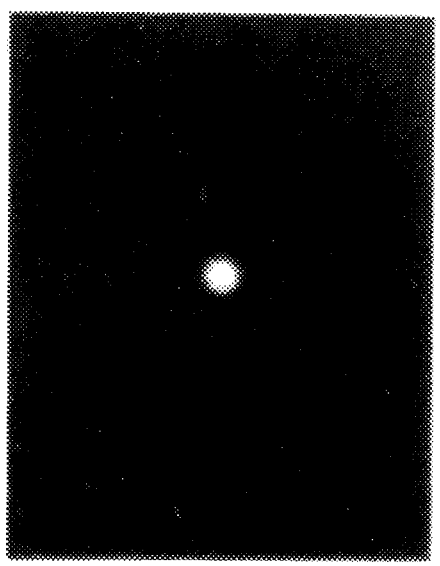
FIG. 7 is a transmission electron micrograph showing an electron diffraction image of the same hard Al—Ti—N thin film as shown in FIG. 6.
Figure 8:
FIG. 8 is a transmission electron micrograph showing a dark-field image in 100,000 magnifications of the same hard Al—Ti—N thin film as shown in FIG. 6.
Figure 9:
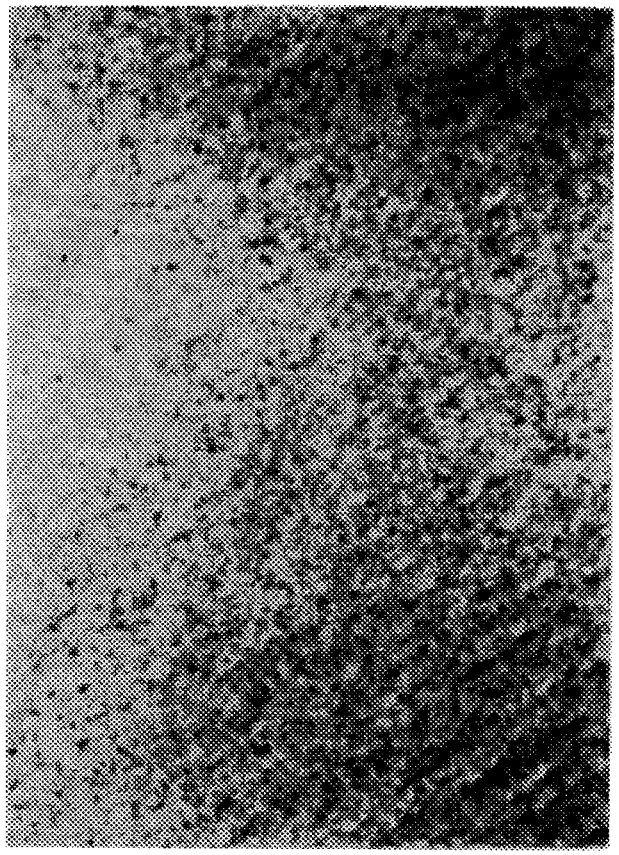
FIG. 9 is a transmission electron micrograph showing a bright-field image in 100,000 magnifications of a hard Al—Ti—N thin film obtained by heat-treating an amorphous film having a composition of $(Al_{80}Ti_{20})_{100-x}N_x$ produced at a partial pressure of nitrogen of 0.07 Pa in Example 1.
Figure 10:
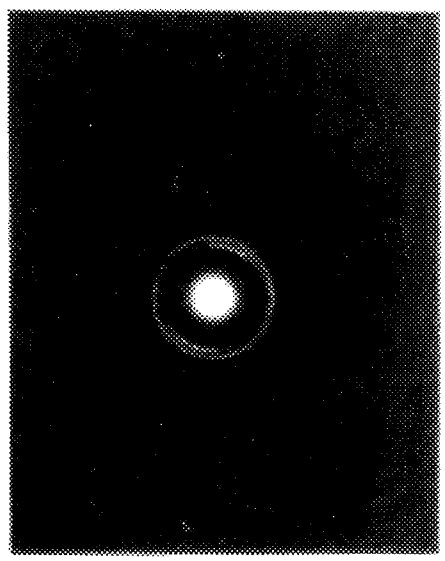
FIG. 10 is a transmission electron micrograph showing an electron diffraction image of the same hard Al—Ti—N thin film as shown in FIG. 9.
Figure 11:
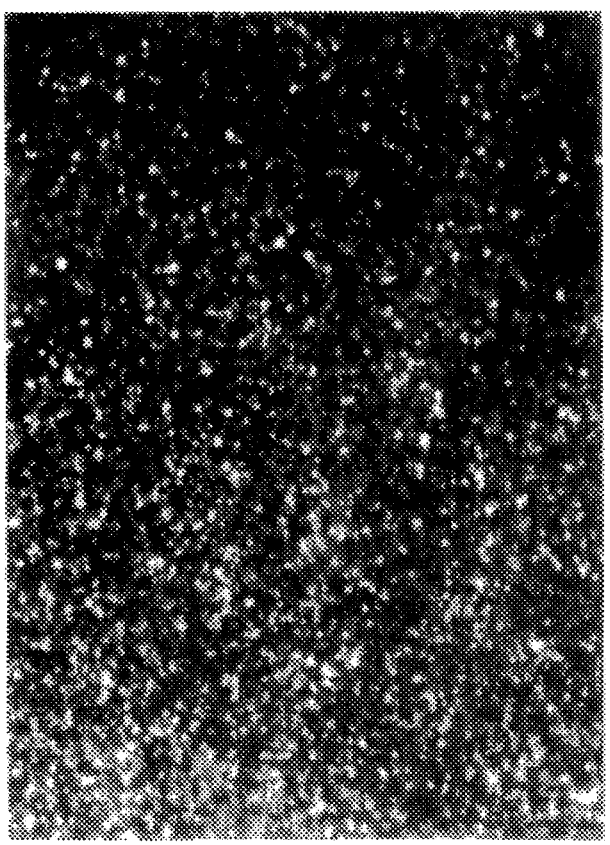
FIG. 11 is a transmission electron micrograph showing a dark-field image in 100,000 magnifications of the same hard Al—Ti—N thin film as shown in FIG. 9.

FIGS. 6 to 8 are micrographs taken through the transmission electron microscope (TEM) of the cross section of an Al—Ti—N thin film obtained by subjecting an amorphous film produced at the partial pressure of nitrogen of 0.052 Pa to the heat treatment in the same manner as in Example 1. FIG. 6 shows a bright-field image in 100,000 magnifications and FIG. 7 is an electron beam diffraction image of the same sample as that of FIG. 6. FIG. 8 shows a dark-field image in 100,000 magnifications of the same sample as that of FIG. 6, clearly depicting the state of dispersion of fine crystalline particles. FIGS. 9 to 11 are transmission electron micrographs of the cross section of an Al—Ti—N thin film obtained by subjecting an amorphous film produced at the partial pressure of nitrogen of 0.07 Pa to the heat treatment in the same manner as in Example 1. FIG. 9 shows a bright-field image in 100,000 magnifications and FIG. 10 is an electron beam diffraction image of the same sample as that of FIG. 9. FIG. 11 shows a dark-field image in 100,000 magnifications of the same sample as that of FIG. 9, clearly depicting the state of dispersion of fine crystalline particles. It is clearly noted from these TEM photographs that the method of the present invention permitted production of a thin film having fine ceramic particles uniformly dispersed in a matrix phase of amorphous metal.

EXAMPLE 2

(A) Formation of a structurally gradient film:

A target made of an alloy of 80 at % Al-20 at % Ti was set in place as opposed to an electrode (grounding potential) inside a magnetron sputter device and a substrate made of a glass plate to be subjected to deposition was disposed between the electrode and the target. In this setup, the formation of a film was carried out by the following procedure.

The substrate was preparatorily cleaned in acetone with ultrasonic wave for three minutes.

The substrate was attached to a sample retaining device inside the sputter device. Then, the sputter device was evacuated to a reduced pressure below $5\times10^{-5}$ Pa with a rotary pump and a turbo molecular pump. Then argon gas was introduced in a prescribed amount into the sputter device and the pressure inside a chamber was kept at 1 Pa by controlling the opening degree of a main valve. To the sample retaining device was connected a power supply member having the remaining end thereof connected to a high-frequency power source and the reverse sputtering (etching) of the substrate was effected for 10 minutes to clean the surface of the substrate.

The connection of the sample retaining device and the high-frequency power source was broken after the completion of the etching. Subsequently, argon gas was introduced into the chamber and the main valve was adjusted to set the pressure inside the chamber at 1 Pa. A DC power source was connected to the target and a preliminary discharge (pre-sputtering) was effected for 10 minutes to clean the surface of the target. In this case, a stainless steel plate was disposed as a shutter in front of the terget to prevent the substrate from being coated by this pre-sputtering.

After the pre-sputtering, the shutter was moved so as to establish opposition between the target and the substrate, while the substrate was being coated, the feed rate of nitrogen gas as a reaction gas into the chamber was electrically controlled so as to increase continuously at a fixed rate. In the meanwhile, the partial pressure of nitrogen in the chamber varied from 0 Pa to 0.13 Pa. At this time, the pressure inside the vacuum chamber was kept at a constant level (1 Pa) by continuously decreasing the feed rate of argon gas by electrical control.

After the coating treatment, the device was left cooling for not less than five mintes to cool the target and other items the temperatures of which were above a room temperature. Then, air was introduced into the chamber until the pressure therein reached a normal atmospheric pressure. The vacuum chamber was opened by removing the lid and the sample was extracted. (B) Heat treatment:

The film formed as described above was placed in a heat-treating furnace provided with an oil diffusion pump and an oil rotary pump and adapted to evacuate the interior thereof. The furnace was evacuated by operating the oil diffusion pump and the oil rotary pump until the pressure therein decreased to a level below $5\times10^{-3}$ Pa. Then, the valve interposed between the furnace and the discharge system was closed and argon gas was introduced into the furnace through one of the valves connected to the furnace until the interior of the furnace reached a normal atmospheric pressure. Subsequently, argon gas was introduced into the furnace and, at the same time, the other valves connected to the furnace were opened to release the argon gas from within the furnace into the ambient air and prevent the pressure inside the furnance from rising beyond the normal atmospheric pressure. During the heat treatment, the pressure of the argon gas being supplied was adjusted and the displacement of gas was continued constantly.

In preparation for the heat treatment, the amount of electric power supplied to the heater of the furnace was controlled by means of electric current so that the heater reached the prescribed temperature in about two hours. The temperature of the heat treatment was set at 550° C. and kept at this level for four hours. The temperature was determined with a thermocouple inserted into the furnace and it was adjusted by opening or closing a switch for the electric current to the heater.

After the heat treatment, the introduction of argon gas into the furnace was continued until the temperature inside the furnace fell below 100° C. After the interior of the furnace had fallen to room temperature, the sample was extracted from the furnace and subjected to analysis and evaluation.

Figure 12:
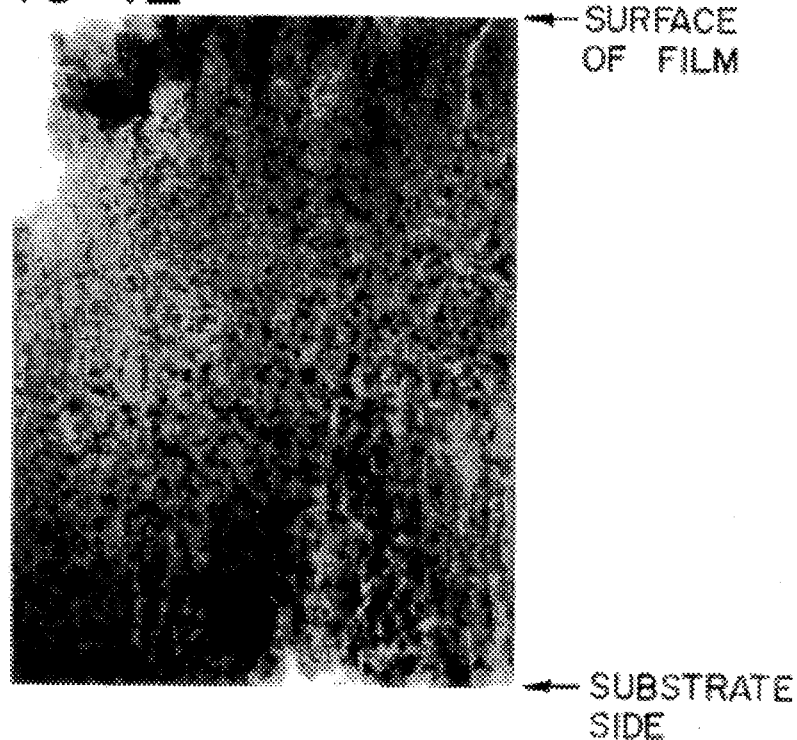
FIG. 12 is a transmission electron micrograph showing a bright-field image in 65,000 magnifications of a hard Al—Ti—N thin film obtained by heat-treating a structurally gradient film having a composition of $(Al_{80}Ti_{20})_{100-x}N_x$ produced in Example 2 to be described hereinafter.
Figure 13:
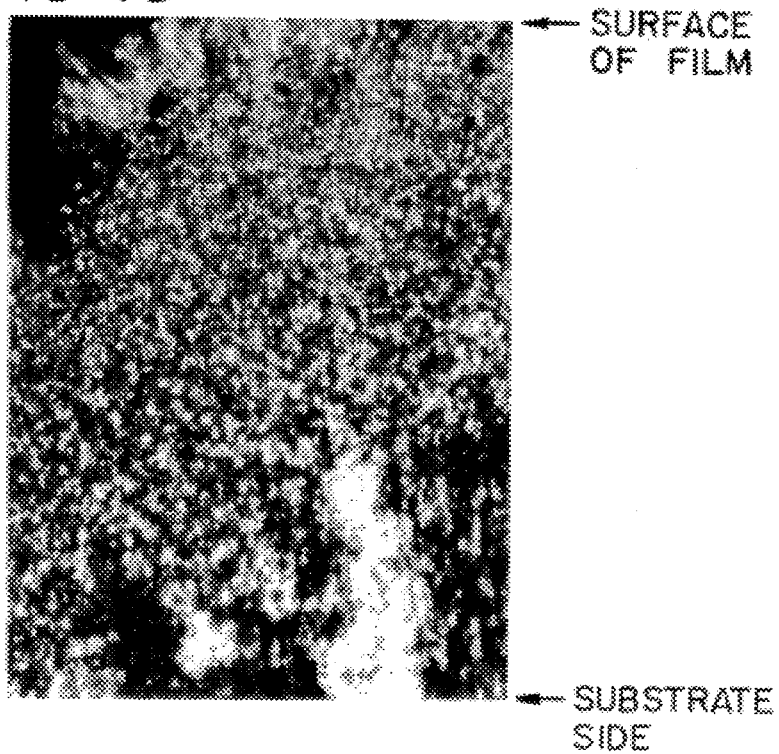
FIG. 13 is a transmission electron micrograph showing a dark-field image in 65,000 magnifications of the same hard Al—Ti—N thin film as shown in FIG. 12.
Figure 14:
FIG. 14 is a transmission electron micrograph showing an electron diffraction image of the same hard Al—Ti—N thin film as shown in FIG. 12.

FIGS. 12 to 14 are transmission electron micrographs of the cross section of structurally gradient (Al, Ti)N thin film produced by the heat treatment described above FIG. 12 shows a bright-field image in 65,000 magnifications and FIG. 14 is an electron diffraction image of the same sample as that of FIG. 12. FIG. 13 shows a dark-field image in 65,000 magnifications of the same sample as that of FIG. 12, clearly depicting the state of dispersion of fine crystalline particles. It is clearly noted from these TEM micrographs that the method of the present invention permitted production of a film having a composition and a structure obliquely varied from a substantially crystalline metallic phase to the surface of the film of an (Al, M)N crystalline ceramic phase, with the ratio of dispersion of fine nitride ceramic particles increased in the direction of the surface of the film. It is further clear that fine crystalline particles not exceeding 50 nm in diameter were observed to have occurred in the film and that the diameters of the particles decreased in proportion as the partial pressure of nitrogen increased during the production of the film.

The data of Knoop hardness which were obtained of heat-treated treated thin films by the use of a microhardness tester are shown in FIG. 15 and the results of the test for adhesiveness of the film conducted by the scratching method (using a scanning scratch tester produced by Shimazu Seisakusho Ltd. and marketed under product code of "SST-101") are shown in FIG. 16. The test results obtained of the same films prior to the heat treatment by way of a comparative experiment are shown in these diagrams in addition to the test results of the functionally gradient films (FGM) produced in the preceding working example. The adhesiveness of a film to a substrate is denoted by the cartridge output which varies in proportion as the load increases and an abrupt increase of the output serves as a sign of separation of the film from the substrate.

From FIG. 15, it is clear that the interior of the functionally gradient film which had undergone the heat treatment showed overall increase in Knoop hardness, particularly by about 300 Hk on the substrate side, and that the manner of variation of Knoop hardness from the substrate side to the surface of film revealed lack of evenness unlike the state of increase of hardness observed in the film of uniform composition. This lack of evenness coincides with the lack of uniformity of the distribution of composition in the heat-treated film and, therefore, is believed to be ascribable mainly to the change of composition due to the phenomenon of diffusion caused by the heat treatment. FIG. 16 clearly indicates that the film after the heat treatment showed an improvement of the adhesiveness to a substrate of about 10% in the crushing load over the film before the heat treatment and that, owing to this improvement, the heat-treated film has a bright prospect of finding utility as a wear-resistant film capable of withstanding elevated temperatures.

EXAMPLE 3

(A) Formation of an amorphous film:

An apparatus having inclined electrode system as shown in FIG. 17 was used for the deposition of a film on a substrate 2. Two targets, a high-purity aluminum disc target 5 and a high-purity manganese disc target 6 were used for preparing the composition of alloy by simultaneously sputtering them. Accordingly, two RF power sources 9 and 10 were used for sputtering the targets. These two targets 5 and 6 attached respectively to supports 7 and 8 were installed obliquely in a sputtering chamber 1 in such a way that the normals to the centers of these two targets should be intersected at the surface of the substrate 2 attached to a holder 3 to be rotated by means of a motor 4.

The proportion of each ingredient for the alloy was controlled by adjusting the electric energy to be supplied to the targets so that the relative amount of aluminum to manganese should be maintained at 80 at % Al-20 At % Mn. The concentration of nitrogen as a variable component in the film to be deposited was controlled by adjusting the feed rate of nitrogen gas into the chamber by means of a mass flow controller in such a manner that the partial pressure of nitrogen in the chamber was continuously increased from 0 Pa to 0.065 Pa.

The coating was carried out after the preliminary evacuation of the chamber and the preliminary sputtering for cleaning the surfaces of targets.

After the coating treatment, the apparatus was left cooling to lower the temperatures of targets and substrate. Then, air was introduced into the chamber until the pressure therein reached a normal atmospheric pressure and the sample was extracted.

FIG. 18 represents the results of analysis performed by the X-ray diffraction on films of uniform composition produced at varying fixed partial pressures of nitrogen. It is clearly noted from FIG. 18 that the data shown therein indicate that the metallic film obtained in the absence of nitrogen gas (partial pressure of nitrogen of 0 Pa) exhibited an amorphous phase and the film changed from an amorphous alloy structure to a crystalline ceramic structure when the partial pressure of nitrogen increased. The film produced at a partial pressure of nitrogen of 0.056 Pa or more acquired a crystalline ceramic phase.

The crystallization temperatures of the amorphous films produced at varying partial pressures of nitrogen were above 300° C. as shown in FIG. 19. The Knoop hardness of the amorphous films produced at varying partial pressures of nitrogen are shown in FIG. 20. The hardness of the film formed at a partial pressure of nitrogen of 0.056 Pa was 1370 Hk.

(B) Heat treatment:

The heat treatment was performed on a film 1 μm in thickness deposited on a glass substrate and a film 33 μm in thickness deposited on an aluminum substrate. These films differed in thickness only. The thickness of the film was controlled by varying the treating period in the formation of film. While the coating was in process, the partial pressure of nitrogen was increased from 0 Pa to 0.065 Pa as described above. Therefore, the nitrogen concentration in the film was increased from the substrate side to the surface part of the film.

The heat treatment was performed on a given sample placed a heat-treating furnace after the furnace had been evacuated $1\times10^{-3}$ Pa and, after the stop of the evacuation, filled with argon gas to normal atmospheric pressure. During the heat treatment, argon gas was constantly introduced into the furnace for the purpose of displacing the internal gas of the furnace.

The temperature of the sample was continuously elevated to 550° C. over a period of two hours and kept at this temperature for further two hours.

After the heat treatment, the sample in the furnace was cooled to room temperature and extracted therefrom.

The film deposited on the aluminum substrate was tested for hardness with a microhardness tester and the film deposited the glass substrate was subjected to a scratch test. The results are shown in FIGS. 21 and 22, respectively.

From FIG. 21 which shows the variation of Knoop hardness in the direction of thickness of the film, it is clear that the film which had undergone the heat treatment had Knoop hardness higher than that of the film which had not undergone the heat treatment in all parts in the section of the film and in some part the Knoop hardness was changed from 1058 Hk of the film which had not undergone the heat treatment to 2169 Hk of the film which had undergone the heat treatment. FIG. 22 clearly indicates that the film after the heat treatment showed a decrease of about 17% in the indentation volume of the scratching needle into the film. This result is believed to be due to the increase in hardness of the film. Thus, the improvement of the fracture strength of the film could be accomplished by the method of the present invention. With respect to the appearance of the scratch mark, it was not found any discernible difference between the the film which had undergone the heat treatment and the film which had not undergone the heat treatment.

While certain specific embodiments have been disclosed herein, the invention may be embodied in other specific forms without departing from the spirit or essential characteristics thereof. The described embodiments are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. A hard thin film consisting of:

a metallic matrix phase having a composition represented by the general formula:

$$Al_aM_b$$

wherein M stands for at least one element selected from the group consisting of Ti, Ta, V, Cr, Zr, Nb, Mo, Hf, W, Mn, Fe, Co, Ni, and Cu and "a" and "b" respectively stand for atomic % in the ranges of $60 \leq a \leq 98.5$ and $1.5 \leq b \leq 40$, providing a+b=100; and fine crystalline particles dispersed in said metallic matrix phase, wherein said film is formed by a physical vapor deposition process.

2. A hard thin film according to claim 1, wherein said metallic matrix phase is substantially composed of an amorphous phase and said fine crystalline particles are ceramic particles measuring not more than 500 nm in diameter.

3. A hard thin film according to claim 1, wherein said metallic matrix phase is substantially composed of a crystalline metallic phase and said fine crystalline particles are ceramic particles measuring not more than 500 nm in diameter.

4. A hard thin film according to claim 1, wherein said fine crystalline particles are nitride ceramic particles measuring not more than 100 nm in diameter.

5. A hard thin film according to claim 1, wherein said fine crystalline particles are uniformly dispersed in said metallic matrix phase throughout the entire volume thereof.

6. A hard thin film according to claim 1, wherein said film has a functionally gradient structure in which the ratio of dispersion of said fine crystalline particles in said metallic matrix phase increases in the direction of thickness of the film.

7. A hard thin film according to claim 2, wherein said film has a functionally gradient structure comprising a matrix phase of amorphous metal and fine nitride crystalline particles dispersed in said matrix phase, the ratio of dispersion of said fine nitride crystalline particles in said matrix phase increasing in the direction of thickness of the film.

8. A hard thin film according to claim 1, wherein the fine crystalline particles dispersed in said matrix phase include fine crystalline particles consisting of aluminum.

9. A hard thin film consisting essentially of a metallic matrix phase having a composition represented by the general formula:

$$Al_aM_b$$

wherein M stands for at least one element selected from the group consisting of Ti, Ta, V, Cr, Zr, Nb, Mo, Hf, W, Mn, Fe, Co, Ni, and Cu and "a" and "b" respectively stand for atomic % in the ranges of $60 \leqq a \leqq 98.5$ and $1.5 \leqq b \leqq 40$, providing a+b=100; and fine nitride ceramic particles dispersed in said matrix phase, the ratio of dispersion of fine nitride ceramic particles in said matrix phase increasing in the direction of thickness of the film so that said film has a composition and structure obliquely varied from a substantially crystalline metallic phase to an (Al,M)N crystalline ceramic phase, wherein said film is formed by a physical vapor deposition process.

10. A hard thin film according to claim 9, wherein said fine nitride ceramic particles are aluminum nitride particles measuring not more than 100 nm in diameter.

11. A hard thin film according to claim 9, wherein said fine nitride ceramic particles have diameters thereof decreased and the density of dispersion thereof increased in the direction of thickness of the film.

12. A hard thin film consisting essentially of:

a metallic matrix phase having a composition represented by the general formula:

$$Al_aM_b$$

wherein M stands for at least one element selected from the group consisting of Ti, Ta, V, Cr, Zr, Nb, Mo, Hf, W, Mn, Fe, Co, Ni, and Cu and "a" and "b" respectively stand for atomic % in the ranges of $60 \leqq a \leqq 98.5$ and $1.5 \leqq b \leqq 40$, providing a+b=100;

fine nitride ceramic particles dispersed in said matrix phase, the ratio of dispersion of fine nitride ceramic particles in said matrix phase increasing in the direction of thickness of the film so that said film has a composition and structure obliquely varied from a substantially crystalline metallic phase to an (Al,M)N crystalline ceramic phase; and fine crystalline particles of intermetallic compound $Al_5Ti_2$ dispersed in said matrix phase, wherein said film is formed by a physical vapor deposition process.

13. A hard thin film according to claim 1, wherein the fine crystalline particles dispersed in said matrix phase include fine crystalline particles consisting of $Al_5Ti_2$.

14. A hard thin film consisting essentially of:

an amorphous metallic matrix phase having a composition represented by the general formula:

$$Al_aM_b$$

wherein M stands for at least one element selected from the group consisting of Ti, Ta, V, Cr, Zr, Nb, Mo, Hf, W, Mn, Fe, Co, Ni, and Cu and "a" and "b" respectively stand for atomic % in the ranges of $60 \leqq a \leqq 98.5$ and $1.5 \leqq b \leqq 40$, providing a+b=100; and fine crystalline particles dispersed in said metallic matrix phase, said fine crystalline particles being precipitates produced by a heat treatment of said amorphous phase.

15. A hard thin film according to claim 14, wherein the fine crystalline particles dispersed in said matrix include ceramic particles not more than 500 nm in diameter.

16. A hard thin film according to claim 14, wherein the fine crystalline particles dispersed in said matrix phase included nitride ceramic particles not more than 100 nm in diameter.

17. A hard thin film according to claim 14, wherein the fine crystalline particles dispersed in said matrix phase include fine crystalline particles consisting of $Al_5Ti_2$.

18. A hard thin film according to claim 14, wherein said fine crystalline particles are uniformly dispersed in said matrix phase throughout the entire volume thereof.

19. A hard thin film according to claim 14, wherein said film has a functionally gradient structure in which the ratio of dispersion of said fine crystalline particles in said matrix phase increases in the direction of thickness of the film.

* * * * *

UNITED STATES PATENT AND TRADEMARK OFFICE
CERTIFICATE OF CORRECTION

PATENT NO. :     5,648,174

DATED      :     July 15, 1997

INVENTOR(S) :    Hiroshi YAMAGATA et al.

It is certified that error appears in the above-identified patent and that said Letters Patent is hereby corrected as shown below:

Title page;   item [57], line 16 of Abstract, "react/on" should read --reaction--.

Signed and Sealed this

Twentieth Day of October, 1998

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,648,174
DATED : July 15, 1997
INVENTOR(S) : YAMAGATA et al.

It is certified that error appears in the above-indentified patent and that said Letters Patent is hereby corrected as shown below:

On the Title Page, item [73], line 1, after "Assignees:",

"Yoshida Kogyo K.K." should read --YKK Corporation--.

Signed and Sealed this

Tenth Day of August, 1999

Attest:

Q. TODD DICKINSON

Attesting Officer

Acting Commissioner of Patents and Trademarks